United States Patent [19]
Tan

[11] Patent Number: 6,060,760
[45] Date of Patent: May 9, 2000

[54] OPTIMAL RESISTOR NETWORK LAYOUT

[75] Inventor: Kien Beng Tan, Singapore, Singapore

[73] Assignee: Tritech Microelectronics, Ltd., Singapore, Singapore

[21] Appl. No.: 08/910,269

[22] Filed: Aug. 13, 1997

[51] Int. Cl.[7] .................................................. H01L 29/40
[52] U.S. Cl. .......................................... 257/536; 257/538
[58] Field of Search ...................... 257/536–543

[56] References Cited

U.S. PATENT DOCUMENTS

| 5,212,653 | 5/1993 | Tanaka | 364/491 |
| 5,218,225 | 6/1993 | Zanders | 257/538 |

FOREIGN PATENT DOCUMENTS

| 58-164257 | 9/1983 | Japan | 257/538 |
| 58-207663 | 12/1983 | Japan | 257/538 |
| 62-032637 | 2/1987 | Japan | 257/538 |
| 1-061046 | 3/1989 | Japan | 257/538 |

*Primary Examiner*—David B. Hardy
*Attorney, Agent, or Firm*—George O. Saile; Stephen B. Ackerman; Bill J. Knowles

[57] ABSTRACT

A resistor network having a precise ratio of resistances of all resistors within the network while having a compact layout to minimize area is described. The integrated circuit resistor network has a plurality of unit resistors. Each unit resistor is composed of a thin film resistive material. The area of the thin film resistive material to form the unit resistor is a median value of the resistor elements to be formed into said integrated circuit resistor network. Each unit resistor has a contact means to connect to the plurality of unit resistors. A plurality of metal interconnection segments will connect to the contact means to form said integrated circuit resistor network. A plurality of metal conductive segments are connected to a metal interconnection segments and to external circuitry to connect the external circuitry to the integrated circuit resistor network.

2 Claims, 4 Drawing Sheets

OPTIMAL RESISTOR NETWORK LAYOUT

BACKGROUND OF THE INVENTION

Field Of The Invention

This invention relates to the formation and structure of integrated circuit resistors and more particularly to resistance network structures that provide accurate resistance ratios and compact layout.

Description of Related Art

A resistance network has many applications in integrated circuits. I It can be applied to a logarithmic control circuit. The resistance network is composed of interconnected resistors that have connections from external circuitry to various points within the resistance network.

Referring to FIG. 1, the resistance network of prior art is formed of the thin film resistive material R and the contact metalization 1, 2, 3, and 4. A conductive material M such as aluminum will be in contact to the contact metalization 1, 2, 3, and 4. The resistor network will be formed of the resistive material R in between each of the contact metalizations 1, 2, 3, and 4. The placement of the actual contact point of the contact metalizations 1, 2, 3, and 4 to the resistive material R can not be accurately controlled within the integrated circuit process. Additionally, the contact metalization 1, 2, 3, and 4, when deposited upon the resistive material R, will cause spiking into the resistive material R. The spiking is where the contact metalization 1, 2, 3, and 4 becomes united with the resistive material R. The addition of the contact metalization 1, 2, 3, and 4 into the resistive material R will cause the resistivity of the resistive material R to vary near the contact metalization 1, 2, 3, and 4 in uncontrollable and unpredictable fashion. The effect of this is a parasitic resistance $rp_1$, $rp_2$, and $rp_3$ for the resistance. The size of the parasitic resistances are not equal and will thus impact on the ratio of the resistances.

If the resistor network RN is to be three resistors $R_1$, $R_2$, and $R_3$ as shown, the critical parameter to be considered in the network is the ratio of the three resistors $R_1$, $R_2$, and $R_3$. When the parasitic contact resistances $rp_1$, $rP_2$, and $rp_3$ of the contact metalization 1, 2, 3, and 4 are added to the resistor network RN, the precision of the ratio of the resistors is impacted by the addition of the parasitic contact resistors $rp_1$, $rp_2$, and $rp_3$. The impact is particularly pronounced when the ratios of the resistors $R_1$, $R_2$, and $R_3$ are to be logarithmic.

Referring now to FIG. 2, the resistive material R is formed as unit resistances U. The thin film material is deposited to form each unit resistor U. A contact metalization C is formed at each end of the unit resistor U. A conductive material M such as aluminum will connect form one contact metalization C on one unit resistor U to a second unit resistor U to for the resistor network RN. The resistance of each unit resistor U will effectively be between the contact metalizations C at each end of the unit resistor U. Since the resistance of the unit resistor U does not include the contact metalization, the resistance values of each of the unit resistors U will be equal to the value of all the other unit resistors U.

In a single wafer, the metal spiking described above, while not controllable or predictable is expected to be similar across the single wafer. If all the unit resistors U are designed to be equal and of a resistance that is relatively larger than the parasitic resistances $r_p$ of the contact C, more precise tracking of the unit resistors U will be achieved. This precise tracking will allow construction of resistor networks with precise rating between the resistors $R_1$, $R_2$, and $R_3$.

A conductive material M such as aluminum is connected to the contact material C at points 1, 2, 3, and 4 to form the external connection points to form the resistors $R_1$, $R_2$, and $R_3$. The resistor $R_1$ will be composed of 4 resistor units U, the resistor $R_2$ will be composed of 7 resistor units U, and the resistor $R_3$ will be composed of 1 resistor unit U.

While this technique for forming resistor networks reduces the parasitic resistances $rp_1$, $rp_2$, and $rp_3$ of FIG. 1, it will force the resistor network RN to be relatively large. This increase in size will be particularly apparent again for logarithmic ratios of the resistors $R_1$, $R_2$, and $R_3$ of the resistor network RN.

U.S. Pat. No. 5,212,653 (Tanaka) discloses a method for producing a layout of a circuit from a circuit configuration that is described in a computer input file. The physical structure of the components must be included in the computer input file.

U.S. Pat. No. 5,218,225 (Zanders) describes a thin film layout of a resistor network to form a potentiometer. The resistor network is a string of resistors. Each resistor has a tab at each end where the contact metalization is connected. The contact metalization does not effect the resistor value. The value or setting of the potentiometer is controlled by digital logic communicating on a serial interface to external control circuitry.

SUMMARY OF THE INVENTION

An object of this invention is to create a resistor network having a precise ratio of resistances of all resistors within the network.

Further another object of this invention is to create a resistor network having a compact layout to minimize the area of the resistor network.

To accomplish these and other objects, an integrated circuit resistor network has a plurality of unit resistors. Each unit resistor is composed of a thin is film resistive material. The area of the thin film resistive material to form the unit resistor is a median value of the resistor elements to be formed into said integrated circuit resistor network. Each unit resistor has a contact metalization to connect to the plurality of unit resistors. A plurality of metal interconnection segments will connect to the contact metalization to form said integrated circuit resistor network. A plurality of metal connective segments are connected to a metal interconnection segments and to external circuitry to connect the external circuitry to the integrated circuit resistor network.

DETAILED DESCRIPTION OF THE INVENTION

Figure 3:
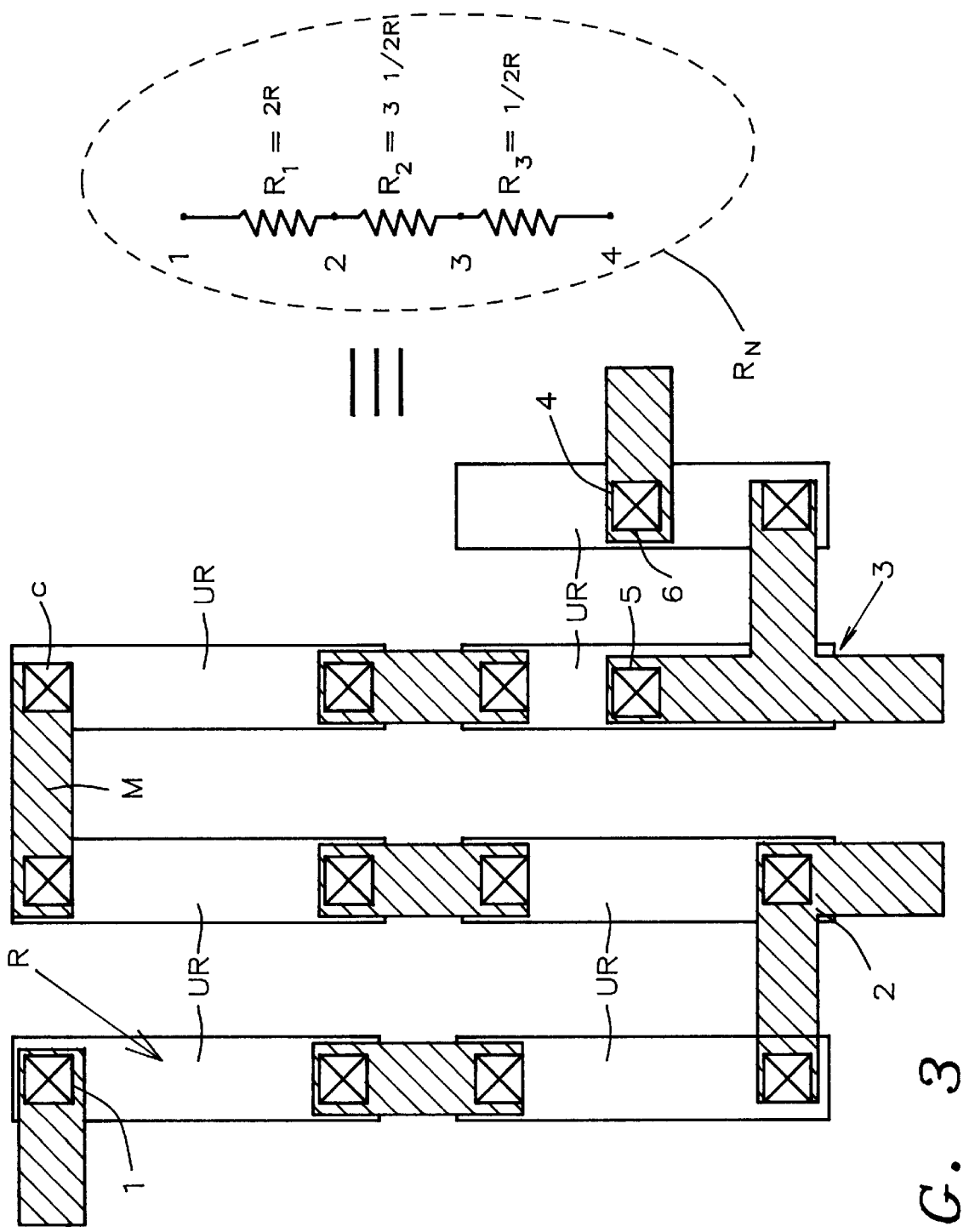
FIG. 3 illustrates a layout of an integrated circuit resistor network of this invention.

To understand the attributes of this invention refer now to FIG. 3. A resistor network RN is formed by serially connecting many unit resistors UR. The unit resistors UR will be placed on a semiconductor wafer in groups that will form columns and rows. A segment of conductive material M such as aluminum will interconnect each of the unit resistors UR. Additional segments of conductive material such as aluminum are placed at points 1, 2, 3, and 4 to provide connection to the external circuitry.

Each unit resistor UR has contact metalization placed at each end to provide a connection from the thin film resistive material R to each segment of the conductive material M. The ratios of all the resistances of the unit resistors UR can be controlled precisely as above described.

Figure 2:
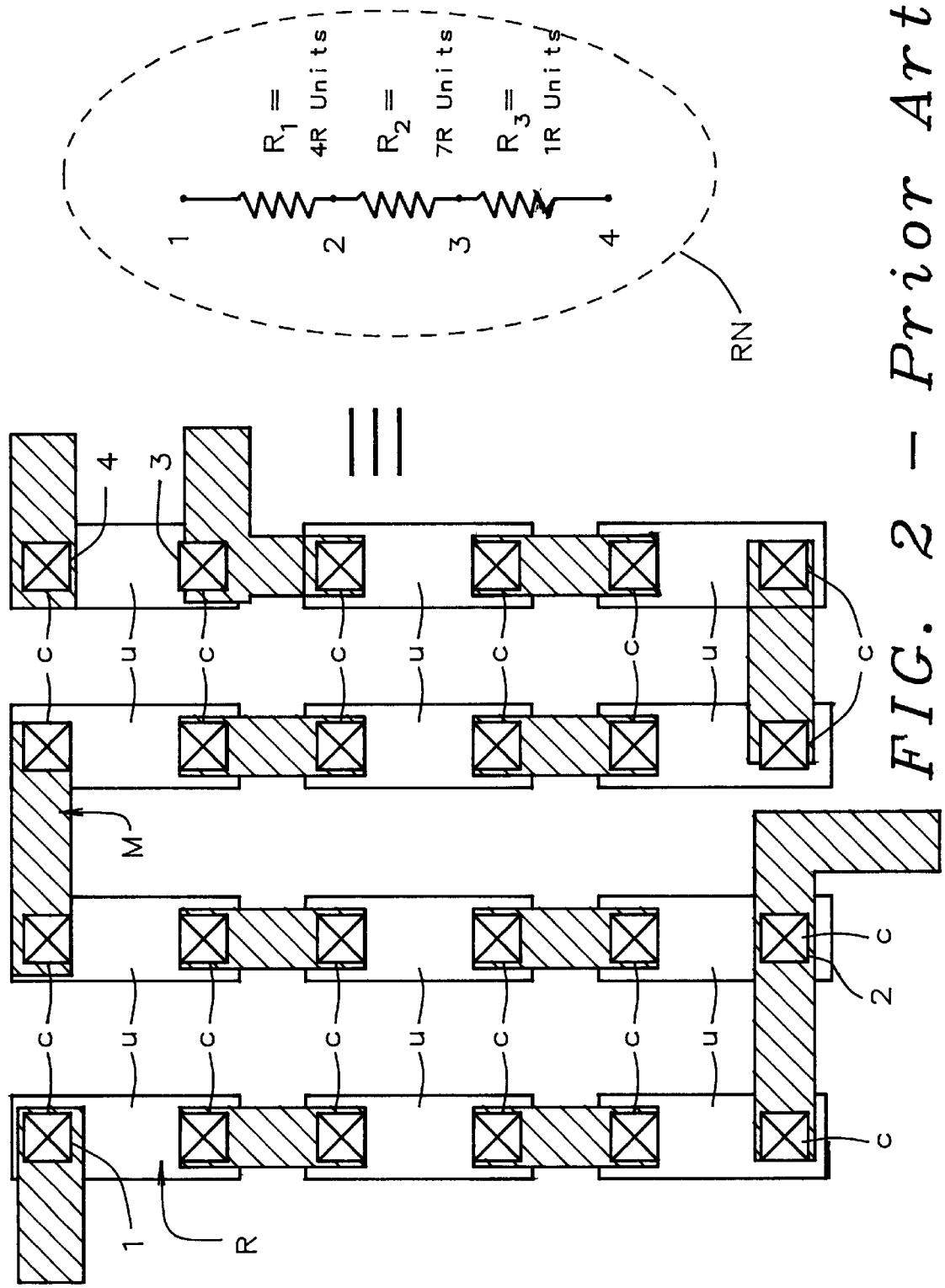
FIG. 2 illustrates a layout of a resistor network of the prior art.

The resistances of each unit resistor UR is much larger than that described in FIG. 2. However, fractional values of the unit resistor UR can be accomplished as shown at points S and 6 by placing the contact metalization not at the end of the unit resistor UR as described above but at the fractional location of the unit resistor UR. As can be seen, the resistor network RN will have resistor $R_1$ equal to 2 unit resistors, resistor $R_2$ equal to 3½ unit resistors, and resistor $R_3$ is equal to ½ unit resistor.

Figure 1:
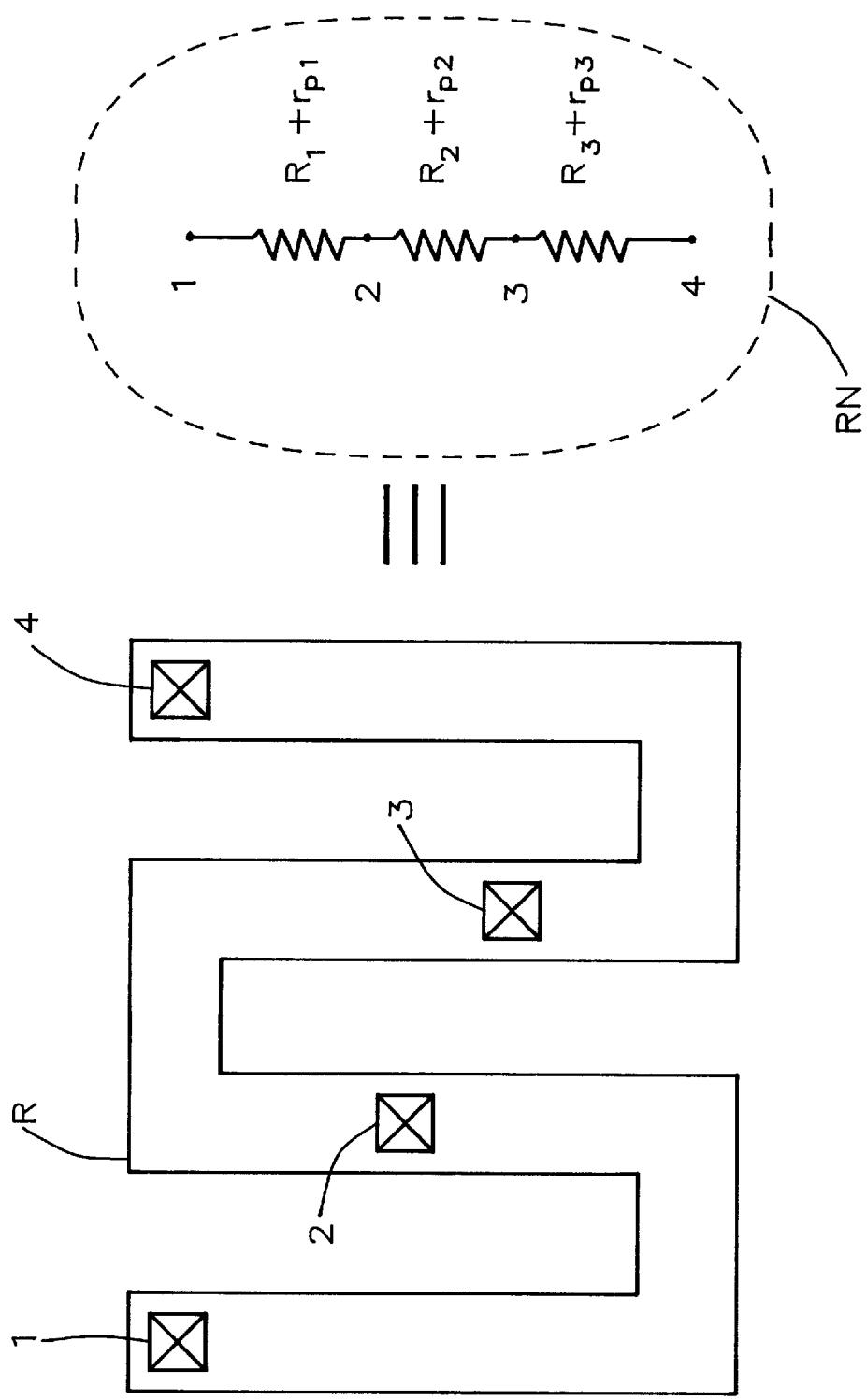
FIG. 1 illustrates a layout of a resistor network of the prior art.

This will allow the resistors $R_1$, $R_2$, and $R_3$ to have their ratios better controlled by removing the parasitic resistors $rp_1$, $rp_2$, and $rp_3$ of FIG. 1 from the resistor network as in FIG. 2 and still maintain a compact design similar to that of FIG. 1.

The size of the unit resistors will be the median value of the values of the resistor segments. For instance if the resistor segments are to be the values of resistors $R_1$, $R_2$, and $R_3$, then each unit resistor will be the median value of the three resistors. The median value of the resistors $R_1$, $R_2$, and $R_3$ is preferably chosen for the unit resistors because it results in the optimum area for the resistor network. If the smallest of the resistors $R_1$, $R_2$, and $R_3$ is chosen, the area for the resistor network becomes very large and wasteful with the numbers of contacts C and the metalization M. However, if the largest of the resistors $R_1$, $R_2$, and $R_3$ is chosen, then a large amount of area is waste having partial unit resistors implementing the smaller resistors in the network.

Figure 4:
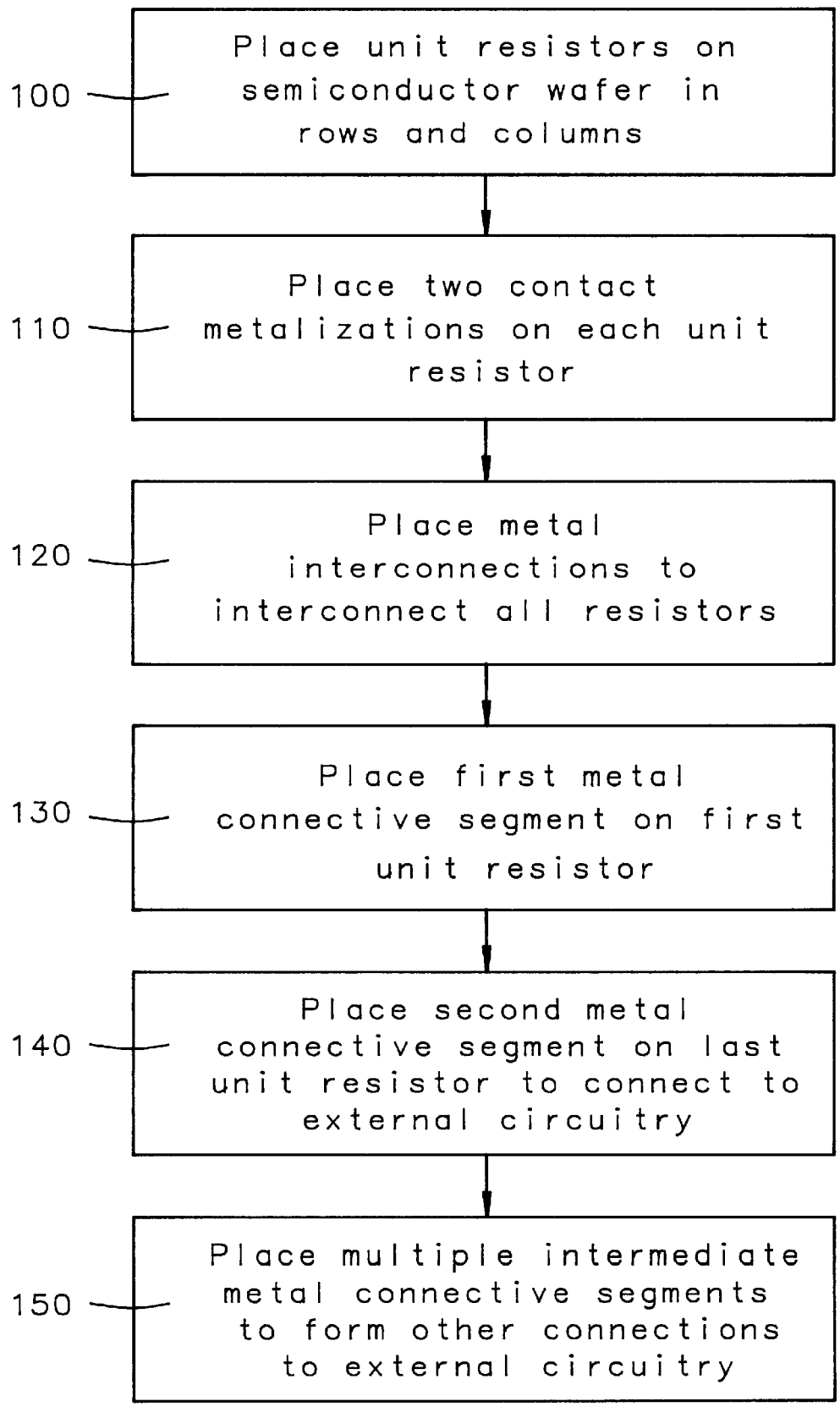
FIG. 4 is a flow diagram of a method to form an integrated circuit resistor network of this invention.

Referring now to FIG. 4, for a method to construct a resistor network on a semiconductor wafer. A plurality of unit resistors are placed 100 upon said semiconductor wafer in a set of columns and rows to form an efficient layout. The resistances of each of the plurality of unit resistors is chosen to be the median value of each the resistors in the resistor network. Two contact means are placed 110 within each of the unit resistors. A metal interconnection segment is placed 120 between one of the two contact means on each of the unit resistors and a second of the two contact means of another of the unit resistors to interconnect the plurality of unit resistors to form the integrated circuit resistor network. A first metal connective segment is placed 130 at a first contact means of a first unit resistor to form a first connection of the integrated circuit resistor network to external circuitry. A second metal connective segment is placed 140 at a second contact means of a last unit resistor to form a second connection of the integrated circuit resistor network to external circuitry. And finally, multiple metal connective segments are placed 150 to some of the contact means of some of the unit resistors to form other connections of the integrated circuit resistor network to external circuitry.

While this invention has been particularly shown and described with reference to the preferred embodiments thereof, it will be understood by those skilled in the art that various changes in form and details may be made without departing from the spirit and scope of the invention.

What is claimed is:
1. An integrated circuit resistor network fabricated upon a semiconductor wafer comprising:
   a) a plurality of unit resistors organized in a series of columns and rows to form a compact layout, wherein each unit resistor is composed of a thin film resistive material and wherein an area of said thin film resistive material is a median value of resistor elements to be formed into said integrated circuit resistor network;
   b) a plurality of contact means placed at the ends of the unit resistors to interconnect to the plurality of unit resistors and having a contact resistance, wherein at least one contact means is selectively adjusted in position on said unit resistor to form a fractional resistor to allow a more precise adjustment to the integrated circuit resistor network, and wherein a magnitude of resistance of each of said unit resistors is large in relationship to the contact resistance to
   c) minimize any impact of said contact resistance will have on the integrated circuit resistor network;
   d) a plurality of metal interconnection segments whereby each metal interconnection segment will connect to the contact means to form said integrated circuit resistor network; and
   e) a plurality of metal connective segments wherein each metal connective segment is connected to one of the plurality of metal interconnection segments and to external circuitry to connect said external circuitry to said integrated circuit resistor network.

2. A method to form an integrated circuit resistor network on a semiconductor wafer comprising the steps of:
   a) placing a plurality of unit resistors upon said semiconductor wafer in a set of columns and rows to form an efficient layout, wherein each unit resistor is composed of a thin film resistive material, and wherein an area of said thin film resistive material is a median value of resistor elements to be formed into said integrated circuit resistor network;
   b) placing two contact means within each of the unit resistors wherein the contact means are placed at the ends of the unit resistor, and whereby a resistance of said unit resistors is large in relationship said contact resistance to minimize any impact of said contact resistance will have on the integrated circuit resistor network;
   c) adjusting the placing of at least one contact means in position on one of said unit resistors to form a fractional resistor for more precise adjustment to the integrated circuit resistor network;
   d placing a metal interconnection segment between a first of the two contact means on each of the unit resistors and a second of the two contact means of another of the unit resistors to interconnect the plurality of unit resistors to form said integrated circuit network;
   e placing a first metal connective segment at a first contact means of a first unit resistor to form a first connection of the integrated circuit resistor network to external circuitry;
   f placing a second metal connective segment at a second contact means of a last unit resistor to form a second connection of the integrated circuit resistor network to external circuitry; and
   g placing multiple metal connective segments to selected contact means of selected unit resistors to form other connections of the integrated circuit resistor network to external circuitry.

* * * * *